(12) United States Patent
Iriguchi

(10) Patent No.: US 10,816,613 B2
(45) Date of Patent: Oct. 27, 2020

(54) MAGNETIC SENSOR CIRCUIT

(71) Applicant: ABLIC Inc., Chiba-shi, Chiba (JP)

(72) Inventor: Masao Iriguchi, Chiba (JP)

(73) Assignee: ABLIC Inc., Chiba (JP)

(*) Notice: Subject to any disclaimer, the term of this patent is extended or adjusted under 35 U.S.C. 154(b) by 201 days.

(21) Appl. No.: 16/032,352

(22) Filed: Jul. 11, 2018

(65) Prior Publication Data

US 2019/0025384 A1 Jan. 24, 2019

(30) Foreign Application Priority Data

Jul. 21, 2017 (JP) .................. 2017-142041

(51) Int. Cl.
| | | |
|---|---|---|
| G01R 33/00 | (2006.01) | |
| G01R 33/07 | (2006.01) | |
| H01L 43/06 | (2006.01) | |
| H03F 3/45 | (2006.01) | |
| G01R 33/09 | (2006.01) | |

(Continued)

(52) U.S. Cl.
CPC ......... G01R 33/07 (2013.01); G01R 33/0041 (2013.01); G01R 33/072 (2013.01); G01R 33/09 (2013.01); G01R 33/091 (2013.01); H01L 43/06 (2013.01); H03F 3/45071 (2013.01); H03F 3/45183 (2013.01); H03K 17/0822 (2013.01);
(Continued)

(58) Field of Classification Search
CPC .. G01R 33/07; G01R 33/0041; G01R 33/072; G01R 33/09; G01R 33/091; H01L 43/06; H03F 3/45071; H03F 3/45183; H03K 17/0822; H03K 17/90; H03K 17/951

USPC ..................................... 324/207.2
See application file for complete search history.

(56) References Cited

U.S. PATENT DOCUMENTS

| | | |
|---|---|---|
| 2014/0103921 A1 | 4/2014 | Raman et al. |
| 2017/0234910 A1* | 8/2017 | Nakamura ........... G01R 15/202 324/251 |
| 2018/0259598 A1 | 9/2018 | Iriguchi |

FOREIGN PATENT DOCUMENTS

| | | |
|---|---|---|
| JP | 2014-190862 | 10/2014 |
| JP | 2018-151257 A | 9/2018 |

OTHER PUBLICATIONS

Frick et al., "Chopper stabilized CMOS integrated front-end for magnetic field measurement" IECON 2006—32$^{nd}$ Annual Conference on IEEE Industrial Electronics Nov. 6-10, 2006, pp. 3090-3094.

* cited by examiner

*Primary Examiner* — Farhana A Hoque
*Assistant Examiner* — Courtney G McDonnough
(74) *Attorney, Agent, or Firm* — Brinks Gilson & Lione

(57) ABSTRACT

A magnetic sensor circuit includes a first type electromagnetic conversion element which supplies antiphase signals corresponding to the intensity of a magnetic field in a first direction, a second type electromagnetic conversion element which supplies antiphase signals corresponding to the intensity of a magnetic field in a second direction, a switch circuit which controls a current supplied from a current source to the first and the second type electromagnetic conversion elements, and a common mode feedback circuit which determines a midpoint voltage between the first and the second type electromagnetic conversion elements. The common mode feedback circuit performs a feedback operation to thereby set an output common voltage of the first type electromagnetic conversion element higher than the preset (Continued)

reference voltage and set an output common voltage of the second type electromagnetic conversion element lower than the preset reference voltage.

7 Claims, 5 Drawing Sheets

(51) Int. Cl.
    *H03K 17/082*     (2006.01)
    *H03K 17/95*     (2006.01)
    *H03K 17/90*     (2006.01)
(52) U.S. Cl.
    CPC ......... *H03K 17/90* (2013.01); *H03K 17/9517* (2013.01)

ized CMOS integrated front-end for magnetic field measurement" in IEEE Industrial Electronics 2006).

MAGNETIC SENSOR CIRCUIT

RELATED APPLICATIONS

This application claims priority under 35 U.S.C. § 119 to Japanese Patent Application No. 2017-142041 filed on Jul. 21, 2017, the entire content of which is hereby incorporated by reference.

BACKGROUND OF THE INVENTION

Field of the Invention

The present invention relates to a magnetic sensor circuit.

Background Art

A magnetic sensor circuit using an electromagnetic conversion element has been used in various electronic devices as a non-contact sensor. The electromagnetic conversion element supplies a voltage signal corresponding to the intensity of an applied magnetic field or an applied magnetic-flux density. The magnetic sensor circuit is used, for example, in a foldable portable phone or the like. The magnetic sensor circuit detects the opening/closing of the lid of the portable phone if a magnetic field exceeds a certain threshold value.

A Hall element is an example of the electromagnetic conversion element. The Hall element supplies a differential output signal corresponding to the intensity of a detected magnetic field. The differential output signal is a signal whose voltages are antiphase to each other. In the following description, the differential output signal is also described as a differential voltage signal.

The Hall element is classified into a horizontal Hall element which detects a magnetic field component vertical to a substrate surface formed with a magnetic sensor circuit, and a vertical Hall element which detects a magnetic field component parallel to the substrate surface. Further, as a magnetic sensor circuit, there is provided one in which a horizontal Hall element and a vertical Hall element are combined together. The magnetic sensor circuit having the horizontal Hall element and the vertical Hall element combined together is used in an encoder IC (Integrated Circuit), an IC for rotational angle detection, etc. The encoder IC detects the rotational speed and direction of a rotating body, based on respective voltage signals from vertical and horizontal magnetic fields. The rotational angle detecting IC calculates a rotational angle thereof based on the voltage signals from the vertical and horizontal magnetic fields.

However, the voltage signal supplied from the Hall element is a signal of a weak voltage having a few tens of μV to a few mV. It is thus difficult to ensure a signal-to-noise power ratio (S/N ratio) of the magnetic sensor circuit. In a circuit having a small signal-to-noise power ratio, there are known a method of connecting a plurality of Hall elements in parallel, and a method of connecting a plurality of Hall elements in series and in parallel for suppressing the asymmetry of devices configuring the magnetic sensor circuit, and an error caused by the structure of each device.

Further, the voltage signal supplied from the Hall element increases or decreases depending on a change in temperature. Driving of the Hall element by a constant voltage source shows a temperature characteristic of second or third order. Rise in the temperature decreases the voltage signal supplied from the Hall element. Constant current driving of the Hall element by a constant current may be used to relax the high order temperature characteristic of the Hall element and lower the temperature coefficient of the output voltage signal. Driving of the Hall element by a constant current source exhibits a temperature characteristic of first or second order.

That is, driving of the Hall element by a constant current source can suppress the amount of change in the voltage signal which changes due to a change in temperature as compared with driving of the Hall element by a constant voltage source. Since the amount of change in the voltage signal can be suppressed, a temperature compensation range can be made narrow. That is, driving of the Hall element by a constant current source eases temperature compensation.

However, in the driving of a Hall element by a constant current source, the output common voltage of the voltage signal supplied from the Hall element changes due to the change in temperature. This is because the signal supplied from the Hall element is a voltage signal, and the output common voltage of this voltage signal greatly changes due to the change in temperature. The large change in the output common voltage restricts the design of a signal processing circuit for the voltage signal supplied from the Hall element is restricted.

A technique used with a common mode feedback circuit has been known for this restriction (e.g., Japanese Patent Application Laid-Open No. 2014-190862, U.S. Published Patent Application No. 2014/0103921, and "Chopper stabilized CMOS integrated front-end for magnetic field measurement" in IEEE Industrial Electronics 2006).

SUMMARY OF THE INVENTION

The above-described related art common mode feedback circuit controls the output common voltage of the differential output signal of the single Hall element. The output common voltage is an intermediate voltage of the above-described differential output signal. It is however difficult to control output common voltages of a plurality of Hall elements connected in series or in parallel respectively.

Further, in a use of a plurality of electromagnetic conversion elements mismatch between drive currents driving the respective electromagnetic conversion elements leads to errors between the electromagnetic conversion elements.

An object of the present invention is to provide a magnetic sensor circuit which performs signal processing on differential output signals supplied from a plurality of electromagnetic conversion elements with satisfactory accuracy.

A magnetic sensor circuit of the present invention is configured as follows:

According to one aspect of the present invention, there is provided a magnetic sensor circuit including a first type electromagnetic conversion element configured to supply signals antiphase to each other corresponding to the intensity of a magnetic field in a first direction, a second type electromagnetic conversion element configured to supply signals antiphase to each other corresponding to the intensity of a magnetic field in a second direction different from the first direction, a power supply terminal, a ground terminal, a switch circuit configured to control flow of a current supplied from a current source to the first type electromagnetic conversion element and the second type electromagnetic conversion element, and a common mode feedback circuit configured to operate on a basis of a preset reference voltage to determine a midpoint voltage between the first type electromagnetic conversion element and the second type electromagnetic conversion element, wherein the common mode feedback circuit performs a feedback operation, based on the midpoint voltage and the preset reference voltage to thereby set an output common voltage of the first type electromagnetic conversion element higher than the preset reference voltage and set an output common voltage of the second type electromagnetic conversion element lower than the preset reference voltage.

According to the present invention, there can be provided a magnetic sensor circuit which performs signal processing on differential output signals supplied from a plurality of electromagnetic conversion elements with satisfactory accuracy.

DETAILED DESCRIPTION OF THE EMBODIMENTS

Embodiments of the present invention will hereinafter be described with reference to the accompanying drawings.
[First Embodiment]

A description will be made to the configuration of a magnetic sensor circuit according to a first embodiment with reference to FIG. 1.

Figure 1:
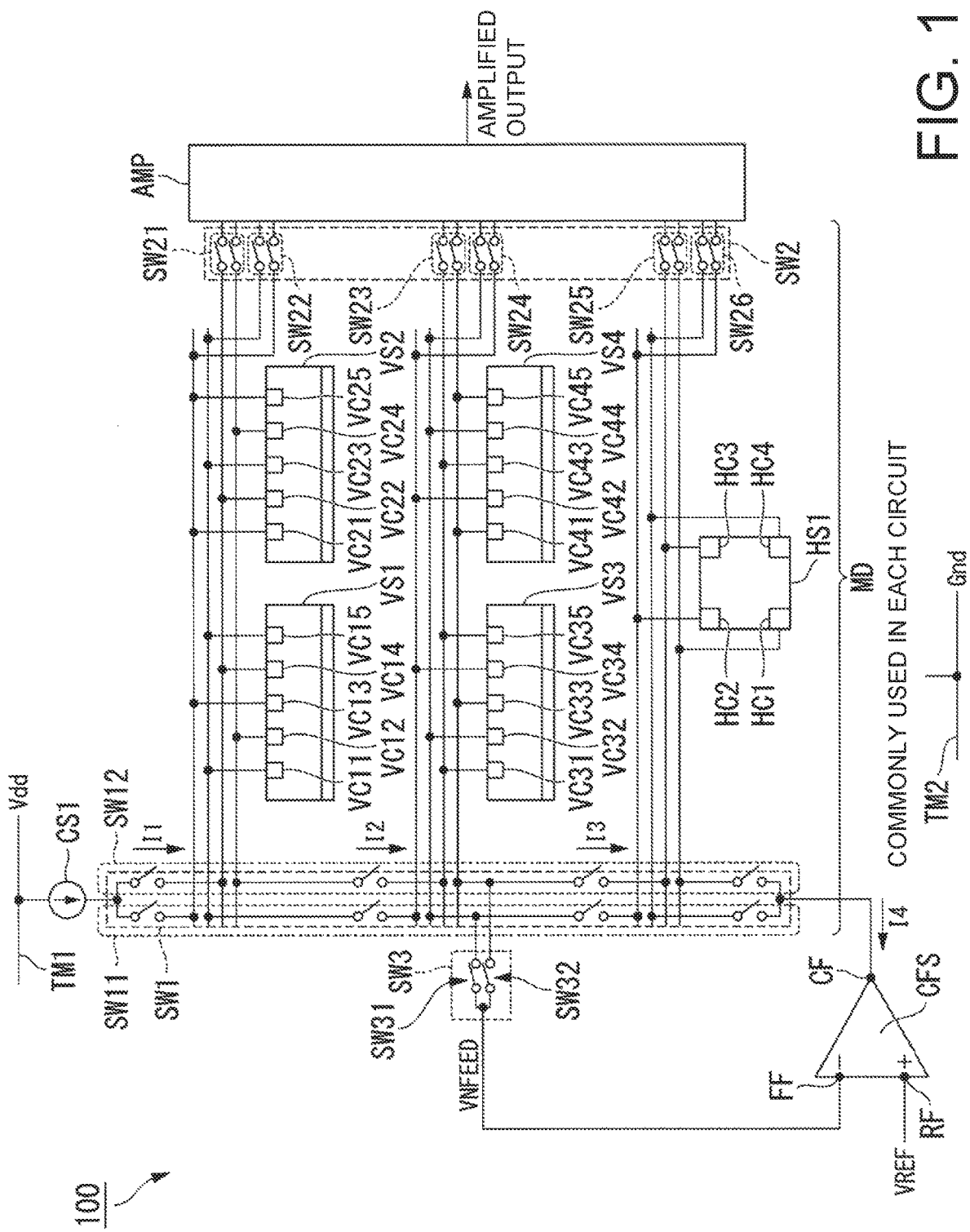
FIG. 1 is a circuit diagram of a magnetic sensor circuit according to a first embodiment.

FIG. 1 is a circuit diagram of the magnetic sensor circuit 100 according to the first embodiment.

The magnetic sensor circuit 100 according to the first embodiment is equipped with a power supply terminal TM1, a ground terminal TM2, a current source CS1, a magnetic detection circuit MD, an amplifier circuit AMP, and a common mode feedback circuit CFS.

The magnetic detection circuit MD is equipped with a first switch circuit SW1, a second switch circuit SW2, a third switch circuit SW3, a vertical Hall element VS1, a vertical Hall element VS2, a vertical Hall element VS3, a vertical Hall element VS4, and a horizontal Hall element HS1. The vertical Hall elements VS1 through VS4 respectively detect a magnetic field component parallel to a substrate surface to which the magnetic sensor circuit 100 is formed. The horizontal Hall element HS1 detects a magnetic field component vertical to the substrate surface.

Here, the horizontal Hall element and the vertical Hall element are respectively one example of an electromagnetic conversion element. The vertical Hall element and the horizontal Hall element are also respectively one example of a first type electromagnetic conversion element and a second type electromagnetic conversion element.

The vertical Hall element VS1 and the vertical Hall element VS2 are connected in parallel with the current source CS1. The vertical Hall element VS3 and the vertical Hall element VS4 are connected in parallel with the current source CS1. The horizontal Hall element HS1 and the vertical Hall elements VS1 through VS4 are connected in series with the current source CS1.

The first switch circuit SW1 is equipped with a first switch SW11 and a first switch SW12. The first switch circuit SW1 is one example of a switch circuit.

The second switch circuit SW2 is equipped with a second switch SW21, a second switch SW22, a second switch SW23, a second switch SW24, a second switch SW25, and a second switch SW26. The second switch circuit SW2 is one example of a second switch circuit.

The first switch circuit SW1 and the second switch circuit SW2 respectively spin the vertical Hall elements VS1 through VS4 and the horizontal Hall element HS1.

Spinning of a Hall element will now be described. Each terminals provided in a Hall element includes a power supply terminal function of positive polarity, a power supply terminal function of negative polarity, a positive-phase signal output function, and a negative-phase signal output function. The spinning is a change in the assignment of the function of each of the terminals included in the Hall elements to thereby switch the direction of a current in the Hall element with respect to a signal output terminal. Further, a connection state prepared for spinning is also described as a phase. In the present embodiment, as described above, the first switch circuit SW1 and the second switch circuit SW2 are used to spin the Hall elements.

The third switch circuit SW3 is equipped with a third switch SW31 and a third switch SW32. The third switch circuit SW3 is one example of a third switch circuit.

The common mode feedback circuit CFS is equipped with a reference voltage terminal RF, a midpoint voltage acquisition terminal FF, and a feedback current output terminal CF.

The vertical Hall element VS1 is equipped with terminals VC11 through VC15. The vertical Hall element VS2 is equipped with terminals VC21 through VC25. The vertical Hall element VS3 is equipped with terminals VC31 through VC35. The vertical Hall element VS4 is equipped with terminals VC41 through VC45. The horizontal Hall element HS1 is equipped with terminals HC1 through HC4.

The power supply terminal TM1 is connected to the current source CS1. A drive voltage is applied from a power supply to the power supply terminal TM1. Specifically, a drive voltage of a voltage Vdd is applied from an unillustrated power supply to the power supply terminal TM1.

The ground terminal TM2 is connected to a ground voltage terminal of each of circuit elements included in the magnetic sensor circuit 100. The circuit elements include the vertical Hall element, the horizontal Hall element, the common mode feedback circuit CFS, the amplifier circuit AMP, etc. A ground voltage Gnd is applied from an unillustrated power supply to the ground terminal TM2.

The current source CS1 is connected to the power supply terminal TM1 and the first switch circuit SW1. Power is supplied from the power supply to the current source CS1. The current source CS1 supplies a current I1 to the first switch circuit SW1.

The first switch circuit SW1 causes the current I1 supplied from the current source CS1 to flow in or out of the vertical Hall elements VS1 through VS4 and the horizontal Hall element HS1.

The first switch circuit SW1 connects the vertical Hall element VS1, the vertical Hall element VS2, the vertical Hall element VS3, the vertical Hall element VS4, and the horizontal Hall element HS1 respectively.

The second switch circuit SW2 acquires a plurality of signals supplied from the vertical Hall elements VS1 through VS4 and the horizontal Hall element HS1. Here, the plurality of signals is a plurality of differential voltage signals. The second switch circuit SW2 supplies the acquired plural differential voltage signals to the amplifier circuit AMP.

The amplifier circuit AMP acquires a plurality of differential voltage signals from the second switch circuit SW2. The amplifier circuit AMP amplifies the acquired differential voltage signals.

The second switch circuit SW2 connects the vertical Hall element VS1, the vertical Hall element VS2, the vertical Hall element VS3, the vertical Hall element VS4, and the horizontal Hall element HS1 to the amplifier circuit AMP respectively. Specifically, the second switch SW21 and the second switch SW22 respectively connect the vertical Hall element VS1 and the vertical Hall element VS2 to the amplifier circuit AMP. The second switch SW23 and the second switch SW24 respectively connect the vertical Hall element VS3 and the vertical Hall element VS4 to the amplifier circuit AMP. The second switch SW25 and the second switch SW26 respectively connect the horizontal Hall element HS1 to the amplifier circuit AMP.

The third switch circuit SW3 acquires a midpoint voltage. The midpoint voltage taken out by the third switch circuit SW3 is also described as a pre-adjustment midpoint voltage VNFEED. Here, the midpoint voltage is a voltage between the vertical Hall element and the horizontal Hall element connected in series with the current source CS1. Specifically, the pre-adjustment midpoint voltage VNFEED is a voltage stepped down by the vertical Hall elements. The third switch circuit SW3 is connected to the first switch circuit SW1 and to the midpoint voltage acquisition terminal FF provided in the common mode feedback circuit CFS.

The common mode feedback circuit CFS operates on the basis of a preset reference voltage VREF. The common mode feedback circuit CFS determines a midpoint voltage being a voltage between each of the vertical Hall elements VS1 through VS4 and the horizontal Hall element HS1. The midpoint voltage determined by the common mode feedback circuit CFS is also described as a post-adjustment midpoint voltage.

The common mode feedback circuit CFS is connected to an unillustrated reference voltage source, the third switch circuit SW3, and the first switch circuit SW1. The midpoint voltage acquisition terminal FF acquires a pre-adjustment midpoint voltage VNFEED from the third switch circuit SW3. Here, the midpoint voltage acquisition terminal FF is an inverting input terminal of the common mode feedback circuit CFS. The reference voltage terminal RF acquires a preset reference voltage VREF from the reference voltage source. The common mode feedback circuit CFS determines a post-adjustment midpoint voltage, based on the pre-adjustment midpoint voltage VNFEED acquired by the midpoint voltage acquisition terminal FF and the reference voltage VREF acquired by the reference voltage terminal RF. The common mode feedback circuit CFS makes a feedback current flow from the feedback current output terminal CF through the first switch circuit SW1 in such a manner that the post-adjustment midpoint voltage becomes equal in potential to the reference voltage VREF.

Here, the vertical Hall element VS1 and the vertical Hall element VS2, the vertical Hall element VS3 and the vertical Hall element VS4, and the horizontal Hall element HS1 can be respectively assumed to be resistors connected in series. The third switch circuit SW3 acquires the above-described pre-adjustment midpoint voltage VNFEED. The taken-out pre-adjustment midpoint voltage VNFEED is supplied to the midpoint voltage acquisition terminal FF.

[Flow of Current in Magnetic Detection Circuit]

A description will next be made to the flow of currents supplied to the plural Hall elements included in the magnetic detection circuit MD.

A current I1 supplied from the current source CS1 is supplied to the vertical Hall element VS1 and the vertical Hall element VS2 through the first switch circuit SW1. The current I1 which has driven the vertical Hall element VS1 and the vertical Hall element VS2 is now supplied to the first switch circuit SW1 as a current I2.

The current I2 is supplied from the first switch circuit SW1 to the vertical Hall element VS3 and the vertical Hall element VS4. The current I2 which has driven the vertical Hall element VS3 and the vertical Hall element VS4 is now supplied to the first switch circuit SW1 as a current I3.

The current I3 is supplied from the first switch circuit SW1 to the horizontal Hall element HS1. The current I3 which has driven the horizontal Hall element HS1 is now supplied to the first switch circuit SW1 as a current I4.

The current I4 is supplied from the first switch circuit SW1 to the feedback current output terminal CF of the common mode feedback circuit CFS. The current I4 is supplied to the ground terminal TM2 through an output stage circuit in the common mode feedback circuit CFS.

Incidentally, the current I1, the current I2, the current I3, and the current I4 are respectively equal in current amount to each other.

[Connection in First Phase of Magnetic Sensor Circuit]

A description will next be made to a connection in the first phase of the magnetic sensor circuit 100 with reference to FIG. 2.

Figure 2:
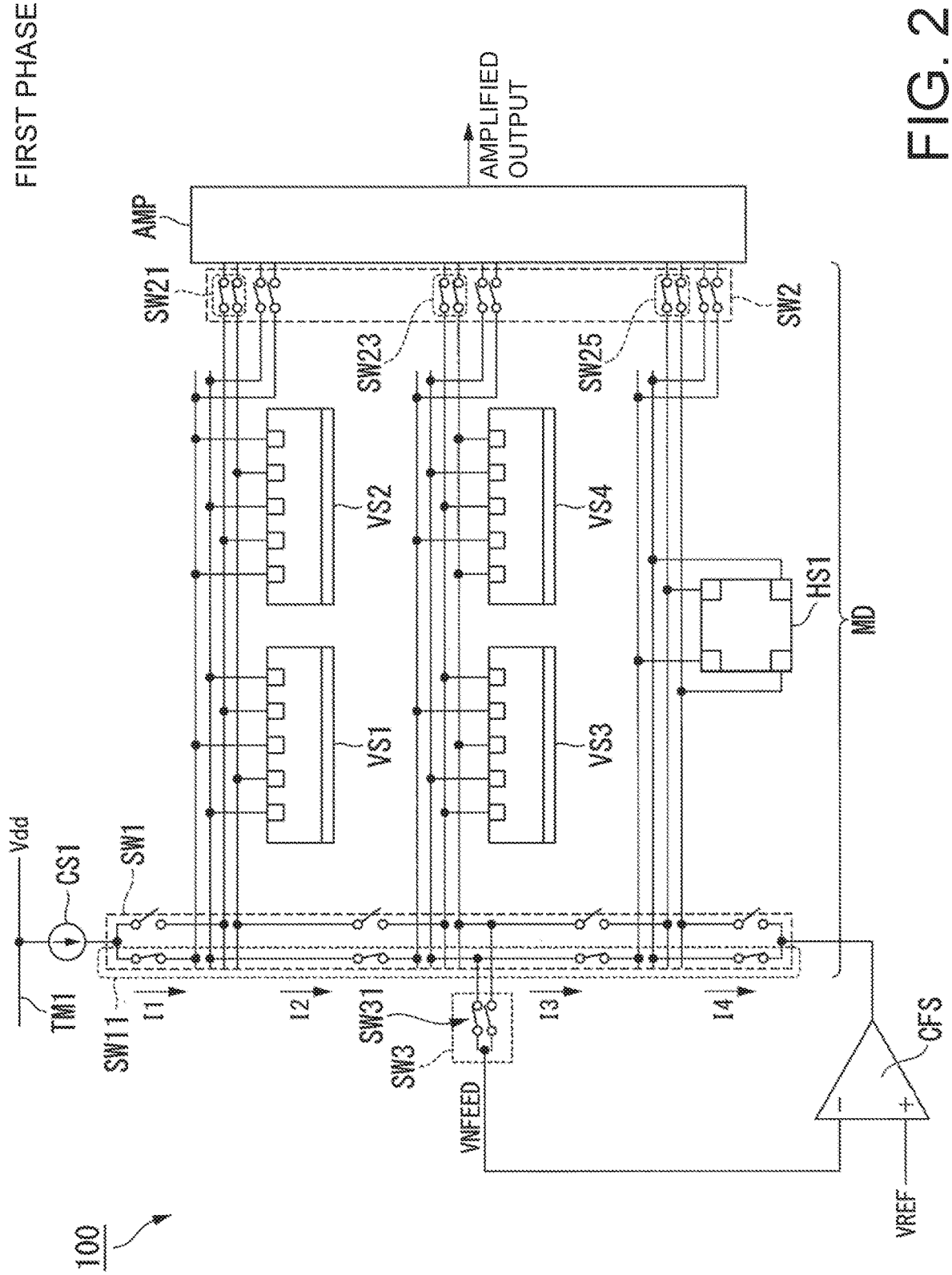
FIG. 2 is a circuit diagram of the magnetic sensor circuit in a first phase.

FIG. 2 is a circuit diagram showing the connection in the first phase of the magnetic sensor circuit 100.

The first switch SW11 supplies a current I1 to the vertical Hall element VS1 and the vertical Hall element VS2 in the first phase. The first switch SW11 supplies a current I2 to the vertical Hall element VS3 and the vertical Hall element VS4 in the first phase. The first switch SW11 supplies a current I3 to the horizontal Hall element HS1 in the first phase.

In the vertical Hall element VS1 the current flows from the terminal VC13 to the terminals VC11 and VC15, and in the Hall element VS2 the current flows from the terminals VC21 and VC25 to the terminal VC23. The combination of terminals is the same in the vertical Hall elements VS1 and VS2, the direction of current flow is opposite in the vertical Hall elements VS1 and VS2.

In the vertical Hall element VS3 the current flows from the terminal VC34 to the terminal VC32, and in the Hall element VS4 the current flows from the terminal VC42 to the terminal VC44. The combination of terminals is the same in the vertical Hall elements VS3 and VS4, the direction of current flow is opposite in the vertical Hall elements VS3 and VS4.

In the Hall element HS1 the current flows from the terminal HC2 to the terminal HC4.

The second switch SW21 supplies differential voltage signals generated between the terminals to which current is not supplied of the vertical Hall elements VS1 and VS2 to the amplifier circuit AMP in the first phase. The second switch SW23 supplies differential voltage signals generated between the terminals to which current is not supplied of the vertical Hall elements VS3 and VS4 to the amplifier circuit AMP in the first phase. The second switch SW25 supplies a differential voltage signal generated between the terminals HC3 and HC1 of the horizontal Hall element HS1 to the amplifier circuit AMP in the first phase. The third switch SW31 acquires a pre-adjustment midpoint voltage VNFEED from the first switch SW11 in the first phase.

[Connection in Second Phase of Magnetic Sensor Circuit]

A description will next be made to a connection in the second phase of the magnetic sensor circuit 100 with reference to FIG. 3.

Figure 3:
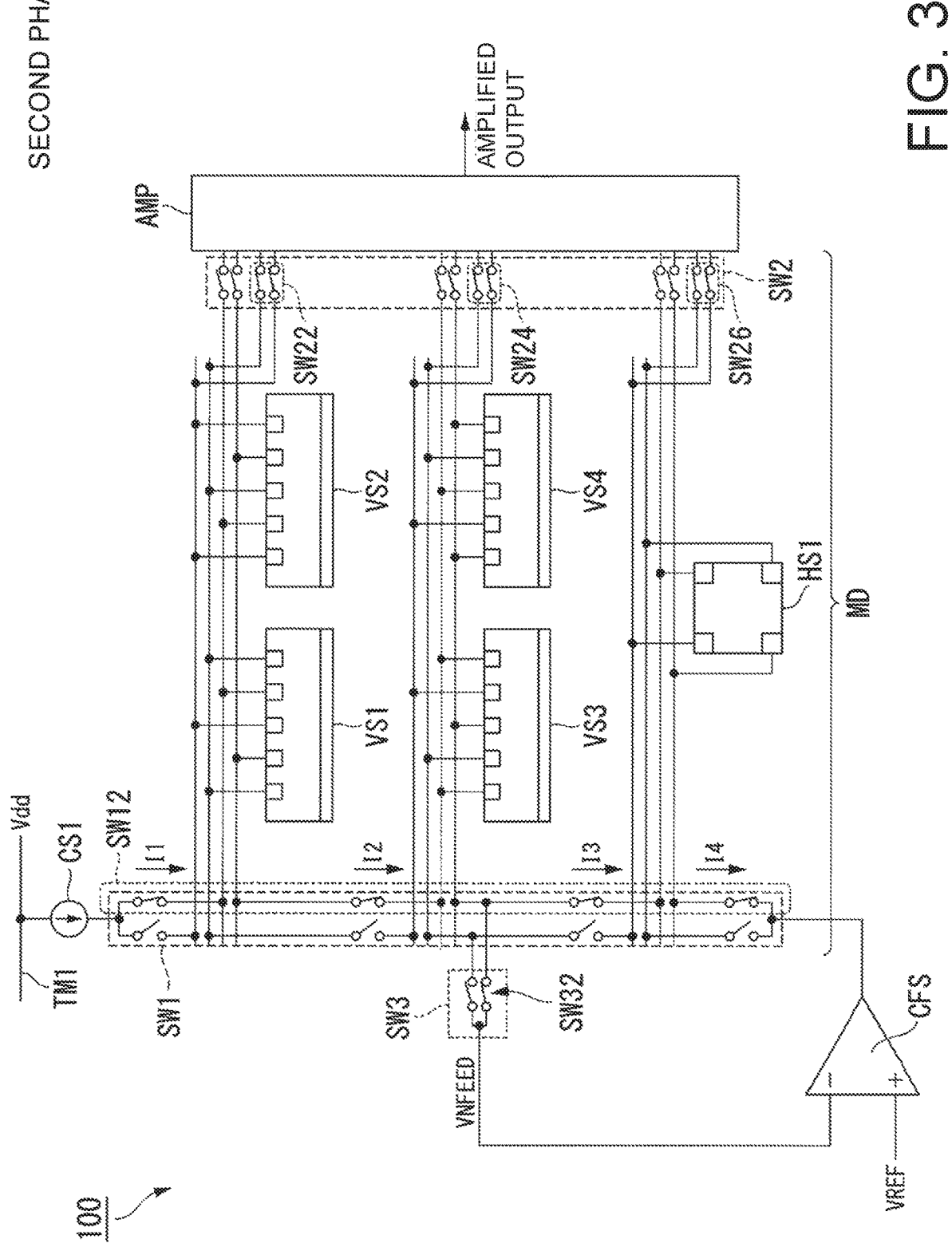
FIG. 3 is a circuit diagram of the magnetic sensor circuit in a second phase.

FIG. 3 is a circuit diagram showing the connection in the second phase of the magnetic sensor circuit 100.

The first switch SW12 supplies a current I1 to the vertical Hall element VS1 and the vertical Hall element VS2 in the second phase. The first switch SW12 supplies a current I2 to the vertical Hall element VS3 and the vertical Hall element VS4 in the second phase. The first switch SW12 supplies a current I3 to the horizontal Hall element HS1 in the second phase.

In the vertical Hall element VS1 the current flows from the terminal VC14 to the terminal VC12, and in the Hall element VS2 the current flows from the terminal VC22 to the terminal VC24. The combination of terminals is the same in the vertical Hall elements VS1 and VS2, the direction of current flow is opposite in the vertical Hall elements VS1 and VS2.

In the vertical Hall element VS3 the current flows from the terminals VC31 and VC35 to the terminal VC33, and in the Hall element VS4 the current flows from the terminal VC43 to the terminals VC41 and VC45. The combination of terminals is the same in the vertical Hall elements VS3 and VS4, the direction of current flow is opposite in the vertical Hall elements VS3 and VS4.

In the Hall element HS1 the current flows from the terminal HC3 to the terminal HC1.

The second switch SW22 supplies differential voltage signals generated between the terminals to which current is not supplied of the vertical Hall elements VS1 and VS2 to the amplifier circuit AMP in the second phase. The second switch SW24 supplies differential voltage signals generated between the terminals to which current is not supplied of the vertical Hall elements VS3 and VS4 to the amplifier circuit AMP in the second phase. The second switch SW26 supplies a differential voltage signal generated between the terminals HC4 and HC2 of the horizontal Hall element HS1 to the amplifier circuit AMP in the second phase. The third switch SW32 acquires a pre-adjustment midpoint voltage VNFEED from the first switch SW12 in the second phase.

[Concerning Common Mode Feedback Circuit]

The common mode feedback circuit CFS is next described with reference to FIG. 4.

Figure 4:
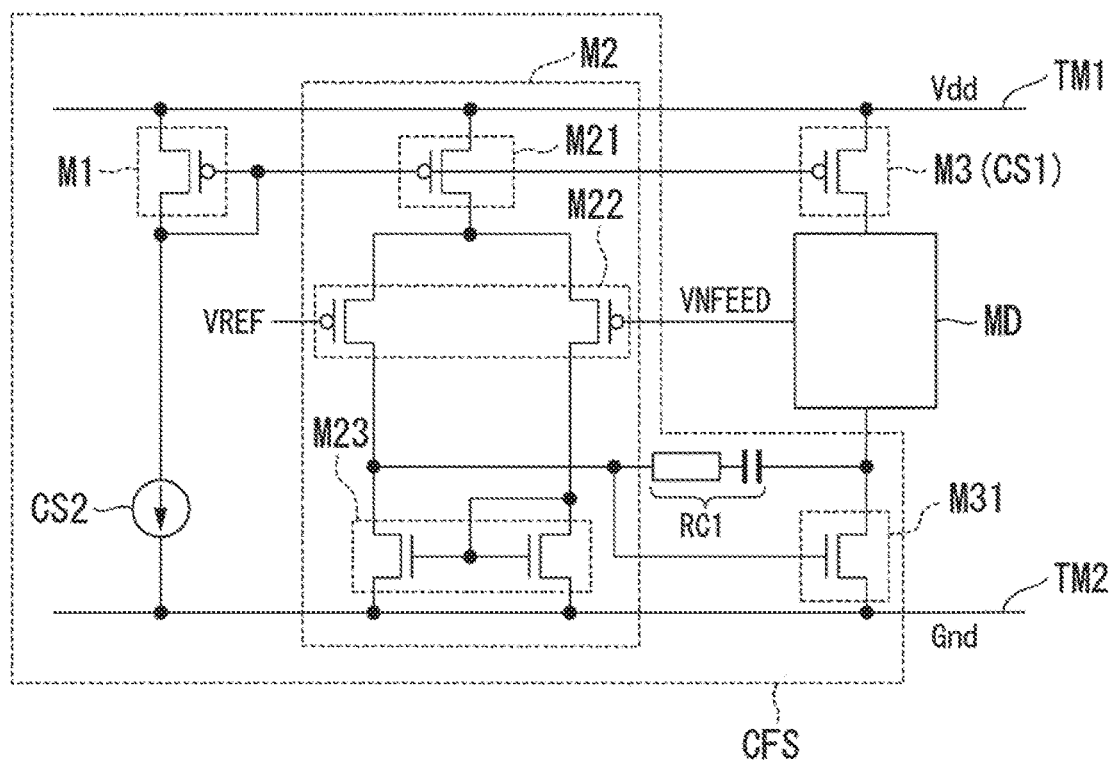
FIG. 4 is a circuit diagram of a common mode feedback circuit.

FIG. 4 is a circuit diagram of the common mode feedback circuit CFS.

The common mode feedback circuit CFS includes a plurality of amplifiers. In the following amplifiers are described to have a CMOS (Complementary metal-oxide-semiconductor) configuration formed from CMOS transistors. Active elements are not, of course, limited to MOS transistors; bipolar transistors can also be used. Further, in the following description, an N-channel type MOS transistor is also described as an NMOS transistor, and a P-channel type MOS transistor is also described as a PMOS transistor. Incidentally, in this example the configuration of the common mode feedback circuit CFS is described by a CMOS amplifier, there are various kinds of circuit configurations for the common mode feedback circuit CFS. For example, the common mode feedback circuit CFS can be constructed from other circuit configuration such as a use of feedback by a discrete circuit of a capacitor and a switch, etc. to have similar circuit operation. Further, the common mode feedback circuit CFS may be an NMOS transistor input two-stage differential amplifier circuit configuration in which a PMOS transistor and an NMOS transistor are complementarily inverted.

More specifically, the common mode feedback circuit CFS includes a PMOS transistor M1, a 1-stage differential amplifier M2, a PMOS transistor M3, an NMOS transistor M31, a phase compensation circuit RC1, and a current source CS2.

The 1-stage differential amplifier M2 includes a PMOS transistor M21, a PMOS differential input pair M22, and an NMOS active load pair M23.

The PMOS transistor M1 and the PMOS transistor M21 form a current mirror circuit. A current corresponding to the size ratio between the PMOS transistor M21 and the PMOS transistor M1 flows through the PMOS transistor M21.

The PMOS transistor M3 and the PMOS transistor M1 form a current mirror circuit. A current corresponding to the size ratio between the PMOS transistor M3 and the PMOS transistor M1 flows through the PMOS transistor M3.

The phase compensation circuit RC1 stabilizes the operation of the 1-stage differential amplifier M2, and includes a resistor and a capacitor or the like.

The 1-stage differential amplifier M2 amplifies a minute differential voltage between the reference voltage VREF and the pre-adjustment midpoint voltage VNFEED to provide to a gate of the NMOS transistor M31 for current sinking. Further, the 1-stage differential amplifier M2 is able to make a highly accurate setting of the post-adjustment midpoint voltage by the feedback operation with the phase compensation circuit RC1.

[Feedback Operation of Common Mode Feedback Circuit CFS]

The feedback operation of the common mode feedback circuit CFS is described herein.

The PMOS transistor M3 forms a current source CS1. On the other hand, the NMOS transistor M31 changes a state of the current sinking according to the state of a differential input of the common mode feedback circuit CFS. The state of the differential input of the common mode feedback circuit CFS is a state between the reference voltage VREF and the pre-adjustment midpoint voltage VNFEED.

In the supply of the current from the current source CS1 to the magnetic detection circuit MD the common mode feedback circuit CFS increases the potential of the gate of the NMOS transistor M31 if the pre-adjustment midpoint voltage VNFEED is higher than the preset reference voltage VREF. Thus the sink current of the NMOS transistor M31 increases. The common mode feedback circuit CFS performs a feedback operation to reduce the pre-adjustment midpoint voltage VNFEED by the increase of the sink current of the NMOS transistor M31.

The common mode feedback circuit CFS decreases the potential of the gate of the NMOS transistor M31 if the pre-adjustment midpoint voltage VNFEED is lower than the preset reference voltage VREF. Thus the sink current of the NMOS transistor M31 reduces. The common mode feedback circuit CFS performs a feedback operation to raise the pre-adjustment midpoint voltage VNFEED by the decrease of the sink current of the NMOS transistor M31.

The common mode feedback circuit CFS is able to make the pre-adjustment midpoint voltage VNFEED equal to the preset reference voltage VREF by the feedback operation. The voltage kept at the preset reference voltage VREF by this feedback operation is a post-adjustment midpoint voltage. If the post-adjustment midpoint voltage and the preset reference voltage VREF are kept equal to each other, the output common voltage of each of the vertical Hall elements VS1 through VS4 is set to a voltage higher than the preset reference voltage VREF, and the output common voltage of the horizontal Hall element HS1 is set to a voltage lower than the preset reference voltage VREF.

Figure 5:
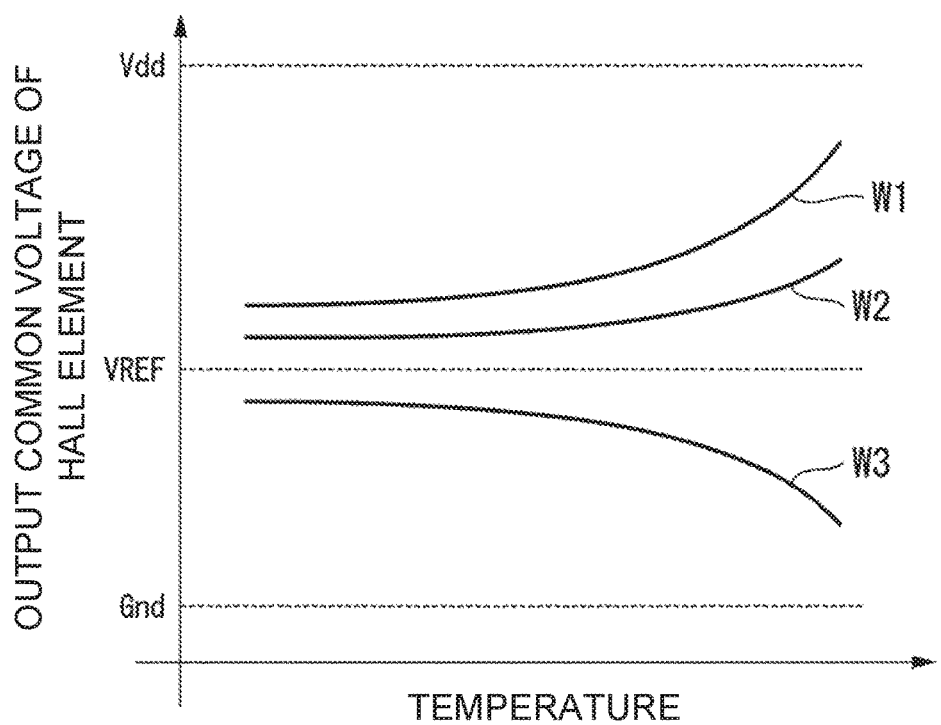
FIG. 5 is a diagram illustrating one example of temperature characteristics of an output common voltage of a Hall element included in a magnetic detection circuit.

A description is made here to the temperature dependence of the output common voltage of each Hall element included in the magnetic detection circuit MD with reference to FIG. 5.

FIG. 5 is a diagram illustrating one example of temperature characteristics of the output common voltage of the Hall element included in the magnetic detection circuit MD.

A curve W1 indicates a temperature dependence of the output common voltage of each of the vertical Hall elements VS1 and VS2. A curve W2 indicates a temperature dependence of the output common voltage of each of the vertical Hall elements VS3 and VS4. A curve W3 indicates a temperature dependence of the output common voltage of the horizontal Hall element HS1.

As illustrated in the curves W1 and W2, the output common voltage of each of the vertical Hall elements VS1 through VS4 is higher than the preset reference voltage VREF. As illustrated in the curve W3, the output common voltage of the horizontal Hall element HS1 is lower than the preset reference voltage VREF.

[Summary of First Embodiment]

As described above, the magnetic sensor circuit 100 includes the magnetic detection circuit MD and the common mode feedback circuit CFS. The common mode feedback circuit CFS sets the midpoint voltage between the first type electromagnetic conversion element and the second type electromagnetic conversion element by the feedback operation. In other words, the common mode feedback circuit CFS sets the output common voltages of the vertical Hall elements VS1 to VS4 to the voltage higher than the preset reference voltage VREF, and the output common voltage of the horizontal Hall element HS1 to the voltage lower than the preset reference voltage VREF. That is, the magnetic sensor circuit 100 is capable of dividing and setting, for every electromagnetic conversion element, the range of the common voltages respectively supplied from the plural electromagnetic conversion elements. Thus, the magnetic sensor circuit 100 is capable of determining the voltage of the differential voltage signal supplied from the magnetic detection circuit MD. The magnetic sensor circuit 100 is capable of relaxing restrictions on design of the signal processing circuit for the differential voltage signal. Further, since the first type electromagnetic conversion element and the second type electromagnetic conversion element are driven by the common constant current, the influence of current source mismatch disappears as compared with the case where each electromagnetic conversion element is driven by an individual current. Further, the magnetic sensor circuit 100 sets the common voltages of the differential voltage signals respectively supplied from the plural electromagnetic conversion elements to thereby make it possible to suppress the mutual interference between the differential voltage signals supplied from the electromagnetic conversion elements different from each other. That is, the magnetic sensor circuit 100 is capable of performing signal processing on the differential output signals supplied from the plural electromagnetic conversion elements with satisfactory accuracy.

Incidentally, although the above description has been made to the case where the common mode feedback circuit is an amplifier formed by CMOS transistors, the present invention is not limited to the case. The common mode feedback circuit may have other configurations such as a feedback circuit of a discrete circuit composed from capacitive components and switches, etc.

Further, the common mode feedback circuit CFS may include a switch which switches the pre-adjustment midpoint voltage VNFEED and the preset reference voltage VREF. Switching by the switch enables reduction of 1/f noise of the amplifier included in the common mode feedback circuit CFS. Here, the 1/f noise is a noise caused by random capture and emission of electrons due to a gate oxide film interface of a MOS transistor. Further, the common mode feedback circuit CFS may have a configuration of a two-stage differential amplifier based on an N-channel MOS transistor input stage, in which a P-channel MOS transistor and an N-channel MOS transistor are complementarily inverted.

[Second Embodiment]

A magnetic sensor circuit according to the second embodiment is next described with reference to FIG. 6. Incidentally, the same components and operations as those in the first embodiment are respectively denoted by the same reference numbers, and their description will therefore be omitted.

Figure 6:
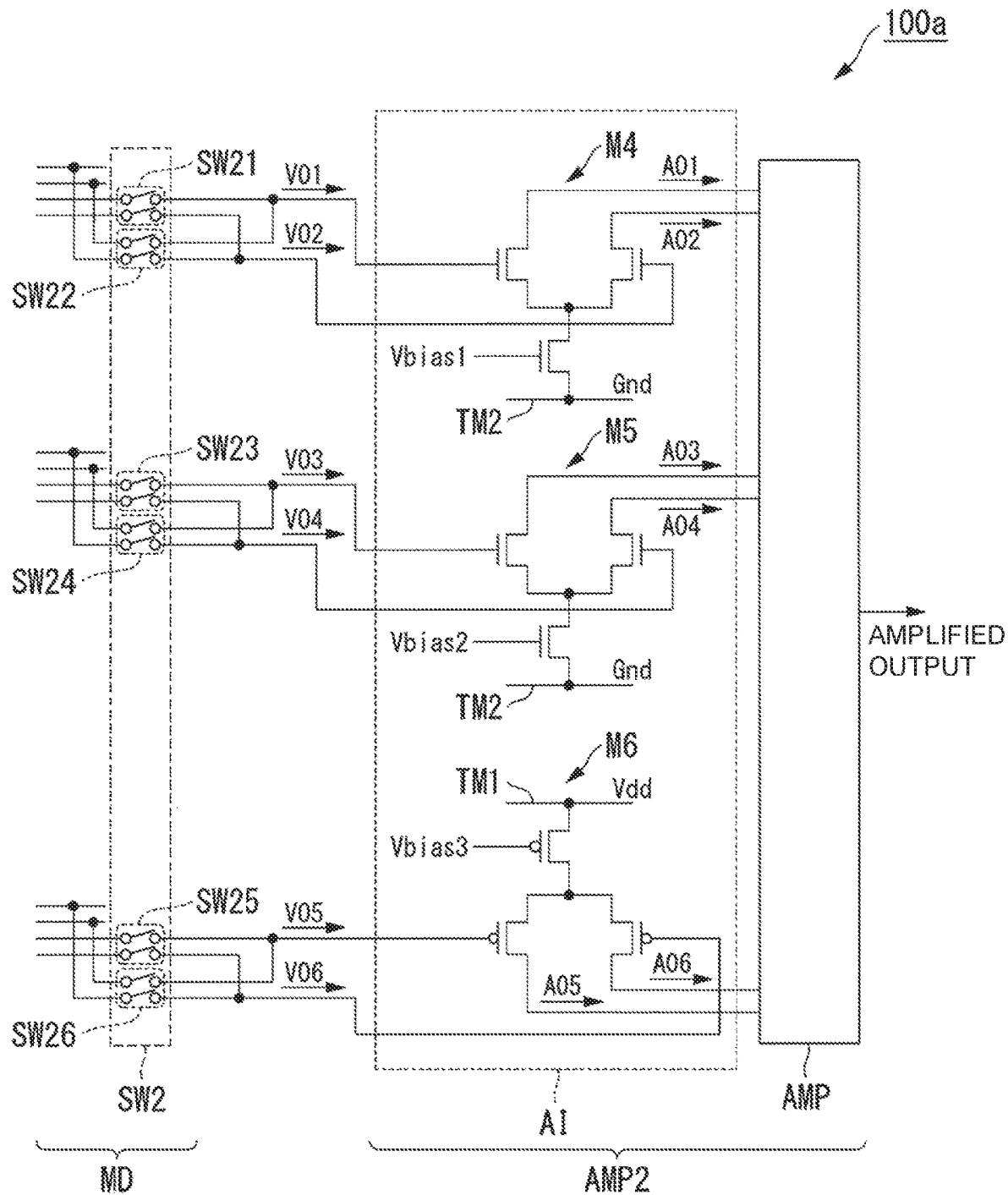
FIG. 6 is a circuit diagram of an amplifier circuit provided in a magnetic sensor circuit.

FIG. 6 is a circuit diagram of an amplifier circuit AMP2 included in the magnetic sensor circuit 100*a*.

The magnetic sensor circuit 100*a* includes a magnetic detection circuit MD, and an amplifier circuit AMP2.

The amplifier circuit AMP2 includes an input stage AI and an amplifier circuit AMP. Here, the amplifier circuit AMP included in the amplifier circuit AMP2 is the same as the amplifier circuit described in the first embodiment. The input stage AI includes a first input stage M4, a second input stage M5, and a third input stage M6.

The input stage AI converts a differentia voltage signal supplied from the magnetic detection circuit MD through a second switch circuit SW2 into a differential current signal. The amplifier circuit AMP performs signal processing on the differential current signal. Here, the amplifier circuit AMP performs the signal processing such as addition, subtraction, separation, amplification, etc.

The first input stage M4 is an NMOS transistor input stage. Specifically, the first input stage M4 is connected to a second switch SW21 and a second switch SW22. The first input stage M4 is connected to a ground terminal TM2. The first input stage M4 is formed by NMOS transistors. A bias current is supplied to the first input stage M4 by an NMOS transistor controlled by a bias voltage Vbias1, so that a current flows from a differential pair of the first input stage M4 to the ground terminal TM2. The differential pair of the first input stage M4 converts differential voltages (VO1 and VO2) into differential currents (AO1 and AO2) with an amplification factor corresponding to the amount of the bias current and supplies the same to the amplifier circuit AMP.

The second input stage M5 is an NMOS transistor input stage. Specifically, the second input stage M5 is connected to a second switch SW23 and a second switch SW24. The second input stage M5 is connected to the ground terminal TM2. The second input stage M5 is formed by NMOS transistors. A bias current is supplied to the second input stage M5 by an NMOS transistor controlled by a bias voltage Vbias2, so that a current flows from a differential pair of the second input stage M5 to the ground terminal TM2. The differential pair thereof converts differential voltages (VO3 and VO4) into differential currents (AO3 and AO4) with an amplification factor corresponding to the amount of the bias current and supplies the same to the amplifier circuit AMP.

The third input stage M6 is a PMOS transistor input stage. Specifically, the third input stage M6 is connected to a second switch SW25 and a second switch SW26. The third input stage M6 is connected to a power supply terminal TM1. The third input stage M6 is formed by PMOS transistors. A bias current is supplied to the third input stage M6 by a PMOS transistor controlled by a bias voltage Vbias3, so that a current flows from the power supply terminal TM1 to a differential pair of the third input stage M6. The differential pair thereof converts differential voltages (VO5 and VO6) into differential currents (AO5 and AO6) with an amplification factor corresponding to the amount of the bias current and supplies the same to the amplifier circuit AMP.

[Summary of Second Embodiment]

As described above, the magnetic sensor circuit 100a includes the amplifier circuit AMP2. The amplifier circuit AMP2 includes the input stage AI and the amplifier circuit AMP.

The input stage AI includes the first input stage M4 through the third input stage M6. The first input stage M4 and the second input stage M5 are respectively composed from the NMOS transistors. The third input stage M6 is composed from the PMOS transistors.

Generally, a differential input stage driven by a constant current does not function unless a saturation operation of a tail current and a differential pair is secured. In the case of the signal common voltage on the power supply voltage side, for example, the NMOS transistor input stage is used. Further, in the case of the signal common voltage on the ground potential side, the PMOS transistor input stage is used. The function of the differential pair can be secured by the selection of the type of MOS transistors configuring the input stage AI.

Here, each of output common voltages of vertical Hall elements VS1 through VS4 which are determined by the common mode feedback circuit CFS is a voltage higher than a preset reference voltage VREF. The voltage higher than the preset reference voltage VREF is a voltage suitable for the NMOS transistor input stage. Further, an output common voltage of a horizontal Hall element HS1 which is determined by the common mode feedback circuit CFS is a voltage lower than the preset reference voltage VREF. The voltage lower than the preset reference voltage VREF is a voltage suitable for the PMOS transistor input stage. Thus, the magnetic sensor circuit 100a sets the preset reference voltage VREF to the voltage corresponding to the input voltage of the amplifier included in the input stage AI to thereby enable the first through third differential input stages included in the input stage AI to perform signal amplification in saturation operation without impairing their functions.

Here, in the magnetic sensor circuit 100a the preset reference voltage VREF can be set to an intermediate voltage between the voltage Vdd and the ground voltage or to an arbitrary voltage corresponding to the operation range of each electromagnetic conversion element included in the magnetic detection circuit MD.

Since the output common voltage of each Hall element is determined by determining the preset reference voltage VREF, the magnetic sensor circuit 100 and the magnetic sensor circuit 100a are capable of definitely performing the proper use of NMOS transistors and PMOS transistors for signal processing amplifying stages, thereby making it possible to relax the restrictions of design on post-stage signal processing.

Incidentally, although the above description has been made to the case where the electromagnetic conversion element is the Hall element, the present invention is not limited to it. The electromagnetic conversion element may be a magnetoresistive sensor.

Incidentally, the number of the terminals of the above-described vertical and horizontal Hall elements is one example, but is not limited to it. Further, the shape of the above-described vertical and horizontal Hall elements is one example, but is not limited to it.

Further, the first electromagnetic conversion element may be a horizontal Hall element. In this case, the second electromagnetic conversion element is a vertical Hall element.

Although the embodiments of the present invention and their modifications have been described above, these embodiments and modifications have been presented as examples and are not intended to limit the scope of the invention. These embodiments and modifications can be implemented in various other forms, and various omissions, substitutions and modifications can be made within the scope not departing from the spirit of the invention. These embodiments and modifications are included in the scope and spirit of the invention and also included in the invention described in the scope of the appended claims and within the scope of equivalency thereof. Further, the above-described embodiments and their modifications can be appropriately combined with each other.

What is claimed is:

1. A magnetic sensor circuit, comprising:
    a first type electromagnetic conversion element configured to supply signals antiphase to each other corresponding to the intensity of a magnetic field in a first direction;
    a second type electromagnetic conversion element configured to supply signals antiphase to each other corresponding to the intensity of a magnetic field in a second direction perpendicular to the first direction;
    a power supply terminal;
    a ground terminal;
    a switch circuit configured to control flow of a current supplied from a current source to the first type electromagnetic conversion element and the second type electromagnetic conversion element; and
    a common mode feedback circuit configured to operate on a basis of a preset reference voltage to determine a midpoint voltage between the first type electromagnetic conversion element and the second type electromagnetic conversion element, the common mode feedback circuit performing a feedback operation based on the midpoint voltage and the preset reference voltage to thereby set an output common voltage of the first type electromagnetic conversion element higher than the preset reference voltage and set an output common voltage of the second type electromagnetic conversion element lower than the preset reference voltage.

2. The magnetic sensor circuit according to claim 1, further comprising:
    a second switch circuit configured to acquire a plurality of signals supplied from the first type electromagnetic conversion element and the second type electromagnetic conversion element; and
    a third switch circuit configured to acquire the midpoint voltage.

3. The magnetic sensor circuit according to claim 1, further comprising a signal amplifier having a P-channel MOS transistor input stage and an N-channel MOS transistor input stage, wherein the signals supplied from the first type electromagnetic conversion element are supplied to the N-channel MOS transistor input stage, and wherein the signals supplied from the second type electromagnetic conversion element are supplied to the P-channel MOS transistor input stage.

4. The magnetic sensor circuit according to claim 1, wherein the first type electromagnetic conversion element is a vertical Hall element configured to detect a magnetic field parallel to a substrate surface formed with the magnetic sensor circuit, and wherein the second type electromagnetic conversion element is a horizontal Hall element configured to detect a magnetic field perpendicular to the substrate surface.

5. The magnetic sensor circuit according to claim 2, further comprising a signal amplifier having a P-channel MOS transistor input stage and an N-channel MOS transistor input stage, wherein the signals supplied from the first type electromagnetic conversion element are supplied to the N-channel MOS transistor input stage, and wherein the signals supplied from the second type electromagnetic conversion element are supplied to the P-channel MOS transistor input stage.

6. The magnetic sensor circuit according to claim 2, wherein the first type electromagnetic conversion element is a vertical Hall element configured to detect a magnetic field parallel to a substrate surface formed with the magnetic sensor circuit, and wherein the second type electromagnetic conversion element is a horizontal Hall element configured to detect a magnetic field perpendicular to the substrate surface.

7. The magnetic sensor circuit according to claim 3, wherein the first type electromagnetic conversion element is a vertical Hall element configured to detect a magnetic field parallel to a substrate surface formed with the magnetic sensor circuit, and wherein the second type electromagnetic conversion element is a horizontal Hall element configured to detect a magnetic field perpendicular to the substrate surface.

* * * * *